United States Patent
Park et al.

(10) Patent No.: US 6,201,487 B1
(45) Date of Patent: Mar. 13, 2001

(54) ERROR DETECTING CIRCUIT IN A LINE LENGTH DECODING SYSTEM

(75) Inventors: Seong Mo Park; Jin Jong Cha; Han Jin Cho, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/368,347

(22) Filed: Aug. 5, 1999

(30) Foreign Application Priority Data

Aug. 26, 1998 (KR) .................................. 98-34556

(51) Int. Cl.$^7$ ............................. H03M 7/40; H03M 13/00

(52) U.S. Cl. ............................. 341/94; 341/67; 382/246; 358/427

(58) Field of Search .................................. 341/94, 67, 65; 714/799, 807, 811, 812; 382/246, 245, 248; 712/200; 375/240; 358/261.1, 427

(56) References Cited

U.S. PATENT DOCUMENTS

| 5,007,102 | * | 4/1991 | Haskell | 382/238 |
| 5,264,848 | | 11/1993 | McGuffin . | |
| 5,694,127 | * | 12/1997 | Tayama | 341/67 |
| 5,764,357 | * | 6/1998 | Dockser | 358/261.1 |
| 6,069,575 | * | 5/2000 | Kinouchi et al. | 341/67 |

OTHER PUBLICATIONS

Dave Galbi et al., "An MPEG–1 Audio/Video Decoder with Run–Length Compressed Antialiased Video Overlays", 1995 IEEE International Solid–State Circuits Conference, pp. 286–287.

* cited by examiner

Primary Examiner—Patrick Wamsley
(74) Attorney, Agent, or Firm—Jacobson, Price, Holman & Stern, PLLC

(57) ABSTRACT

An error detection circuit for detecting errors occurring in a data obtained by decoding a compressed image data block by block in a line length decoding system, includes a first storage device for temporarily storing the run representing the number of zeros ('0's) in the compressed image data and an EOB signal externally inputted, a selection signal generator for generating a first and a second selection signal in response to the EOB signal supplied from the first storage device, a first selection circuit for selectively transferring the run supplied by the first storage device or ground signal according to the first selection signal, a second selection circuit for selectively transferring the run supplied by the first storage device or ground signal according to the second selection signal, a reference value generator for generating a reference value based on the output signal of the first selection circuit according to an operation control signal externally inputted, accumulator for accumulating the output of the second selection circuit based on the feedback signal from a second storage device, the second storage device temporarily storing the output of the accumulator, and an error detector for detecting the errors based on the reference value and the output of the second storage device.

6 Claims, 3 Drawing Sheets

ERROR DETECTING CIRCUIT IN A LINE LENGTH DECODING SYSTEM

BACKGROUND OF THE INVENTION

1. Field of The Invention

The present invention concerns an error detection circuit in a line length decoding system, and more particularly an error detection circuit for detecting errors of decoded data by comparing the states of the data streams in data blocks when decoding data in real time.

2. Technical Background

In the conventional line length decoding system, the error detection circuit generates an absolute address based on the level of the image data and the run representing the number of zeros ('0's) in the image data, and stores it into the memory upon detecting end-of-block (EOB) signal, so that the absolute address is compared to a reference address to generate a digital coefficient signal to detect the bit errors. Hence, the error propagation caused by the successive bit errors is detected to stop the decoding operation, stabilizing the signal processing.

Referring to FIG. 1, the conventional error detection circuit comprises a signal processor 110, first-in first-out (FIFO) device 120, registers 131, 132, 133, up counter 140, comparators 151 and 152, AND gate 160, OR gate 170, and error detector 180. The error detector 180 includes a NAND gate 181 with two inputs receiving the output of the register 131, a NAND gate with two inputs receiving the output of the up counter 140, and an AND gate with two inputs respectively receiving the outputs of the two NAND gates 181 and 182.

In operation, the signal processor 110 accumulates the level of a compressed image data externally inputted and the runs representing the number of '0's in the image data to transfer the absolute address represented by the accumulated value and the inputted level to the FIFO device 120 according to the EOB signal. In addition, the signal processor 110 decodes the compressed image data into the original data. The EOB signal is to indicate that the image data inputted to the signal processor 110 by blocks is positioned in the last block. Then, the FIFO device 120 transfers the absolute address and level to the registers 131 and 132 according to the read signal generated from the AND gate 160. The register 131 transfers the absolute address to the comparators 151 and 152 and the error detector 180. Likewise, the register 132 transfers the level to the AND gate 160.

The up counter 140 transfers the reference address to the comparators 151, 152 and error detector 180 to determine whether the data is correctly decoded by the signal processor 110. Namely, the comparators 151 and 152 compare the absolute address from the register 131 with the reference address from the up counter 140 to determine whether the data has been correctly decoded by the signal processor 110, transferring the resultant signal to the OR gate 170, which logically combines the output signals of the comparators 151 and 152 to generate an output supplied to the AND gate 160. Then, the AND gate 160 logically multiplies the level from the register 132 and the output of the OR gate 170 to generate an output signal supplied to the FIFO device 120 and registers 131, 132 and 133. In this case, when the data decoded by the signal processor 110 conforms with the original data, it transfers the read signal to the FIFO device 120 and registers 131 and 132 while transferring the level to the register 133. Meanwhile, the error detector 180 detects the errors occurring in the data decoded by the signal processor 110 based on the absolute address from the register 131 and the reference address from the up counter 140.

Generally, when decoding in real time the data compressed by the variable length coding, an incorrectly inputted run value displaces the positions of the generated coefficients to make the synchronization of the coefficients mismatched, so that the time taken for processing data is increased or processing errors occur. In order to resolve such problems has been used the above described error detection circuit in the line length decoding system. However, such error detection circuit requires additionally a number of registers to store the absolute address and level generated according to the run, level and EOB signal, complicating its structure. Further, since the signals processed must be read and written by the many registers, the signal processing time is too much consumed to apply it to a high speed decoding system.

SUMMARY OF THE INVENTION

It is an object of the present invention to provide a line length decoding system with a error detection circuit, which employs a minimum number of logic gates to detect errors occurring in a decoded data by comparing the states of the data streams block by block, so that its structure is not only simplified, but also the signal processing speed is considerably improved.

According to the present invention, an error detection circuit for detecting errors occurring in a data obtained by decoding a compressed image data block by block in a line length decoding system, comprises a first storage device for temporarily storing the run representing the number of zeros ('0's) in the compressed image data and an EOB signal externally inputted, a selection signal generator for generating a first and a second selection signal in response to the EOB signal supplied from the first storage device, a first selection circuit for selectively transferring the run supplied by the first storage device or ground signal according to the first selection signal, a second selection circuit for selectively transferring the run supplied by the first storage device or ground signal according to the second selection signal, a reference value generator for generating a reference value based on the output signal of the first selection circuit according to an operation control signal externally inputted, accumulator for accumulating the output of the second selection circuit based on the feedback signal from a second storage device, the second storage device temporarily storing the output of the accumulator, and an error detector for detecting the errors based on the reference value and the output of the second storage device.

The present invention will now described more specifically with reference to the drawings attached only by way of examples.

BRIEF DESCRIPTION OF THE ATTACHED DRAWINGS

DETAILED DESCRIPTION OF PREFERRED EMBODIMENTS

Figure 1:
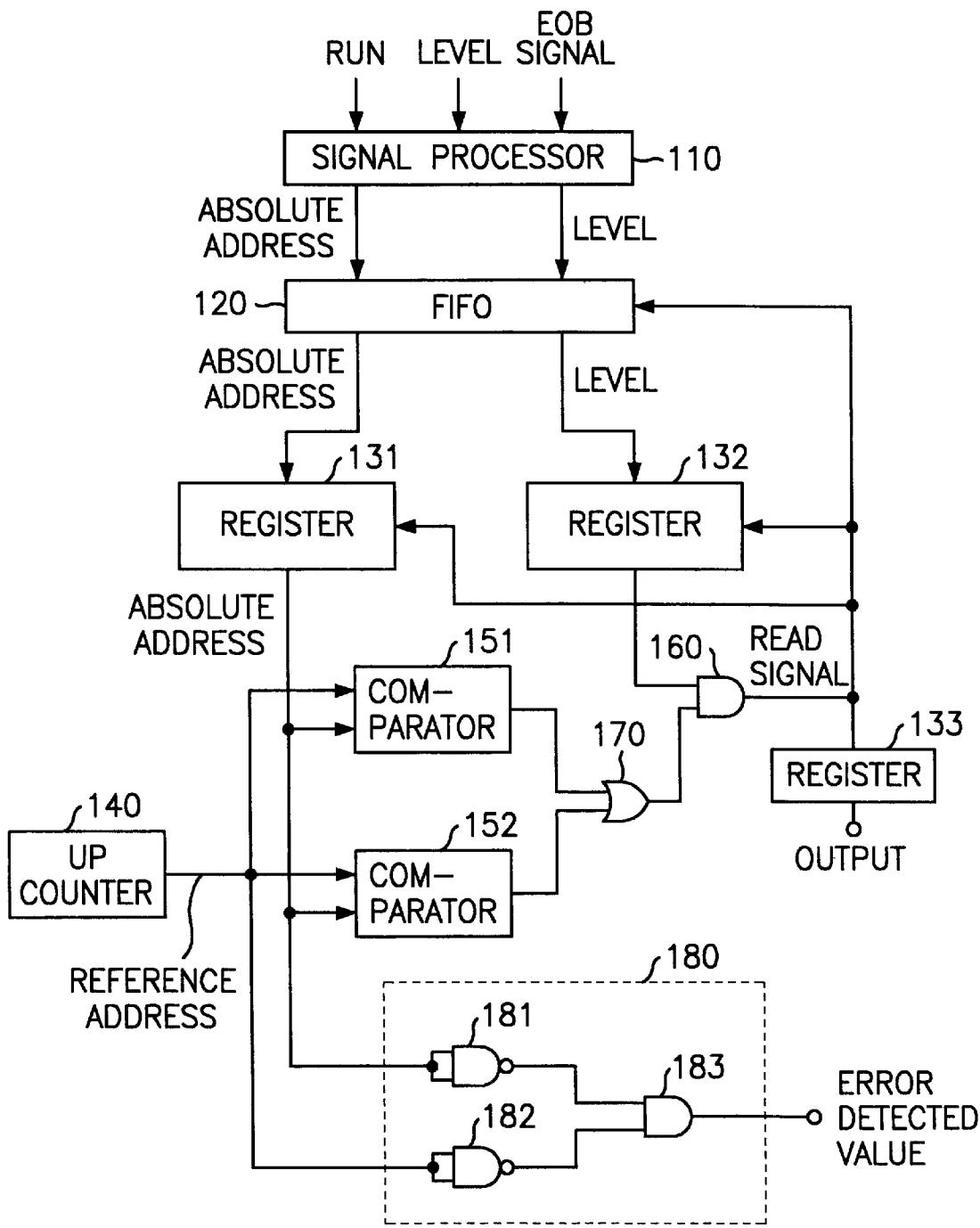
FIG. 1 is a block diagram for illustrating the structure of an error detection circuit in a conventional line length decoding system.
Figure 2:
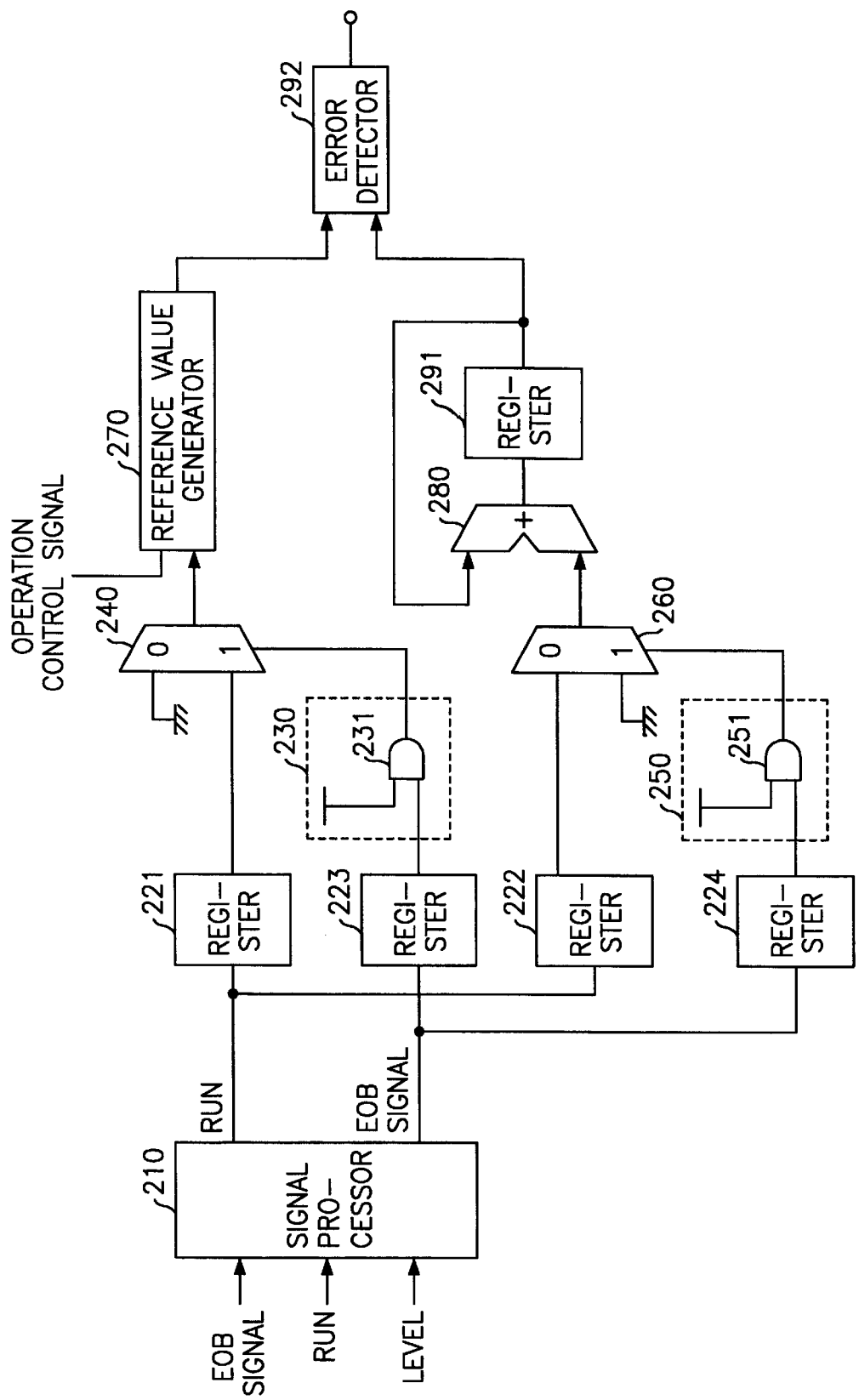
FIG. 2 is a block diagram for illustrating the structure of an error detection circuit in an inventive line length decoding system.

Referring to FIG. 2, the inventive error detection circuit comprises a signal processor 210 for decoding a compressed image data externally inputted to transfer the run, level and EOB signals, registers 221 and 222 for temporarily storing the run from the signal processor, a first selection signal generating circuit 230 for supplying a first selection signal in response to the EOB signal from the register 223, a first selection circuit 240 for selectively transferring the run from the register 221 or ground signal according to the first selection signal, a second selection signal generating circuit 250 for supplying a second selection signal in response to the EOB signal from the register 224, a second selection circuit 260 for selectively transferring the run from the register 222 or ground signal according to the second selection signal, a reference value generator 270 for generating a reference value based on the output signal of the first selection circuit 240, an accumulator 280 for accumulating the output signal of the second selection circuit 260 based on the output signal of a register 291 to temporarily store the output signal of the accumulator 280, and an error detector 292 for comparing the output signal of the register 291 with the reference value from the reference value generator 270 to detect errors occurring in the decoded image data from the signal processor 210.

The first selection signal generating circuit 230 has an AND gate 231 for logically multiplying a high signal '1' of one input and the output signal of the register 223 received through the other input. The second selection signal generating circuit 250 has an AND gate 251 for logically multiplying a high signal '1' of one input and the output signal of the register 224 received through the other input.

The reference value generator 270 includes at least one down counter for counting down the output signal of the first selection circuit 240 according to an operation control signal externally received. The number of the down counter is determined by the value of the run received. Supposing that there are 64 data in one block and the level always has the value '1', the down counter performs the down counting operation by subtracting the output signal of the first selection circuit 240 and the level of '1' from the data number 64 of a predetermined block. The value thus counted down is used as the reference value by the error detector 292 to detect the errors occurring in the data decoded by the signal processor 210. The error detector 292 consists of a comparator for comparing the output signal of the register 291 with the reference value received from the reference value generator 270.

In operation, the signal processor 210 processes the externally compressed image data block by block of 8×8 to reproduce the original data, transferring the inputted run to the registers 221 and 222 and the EOB to the registers 223 and 224. The run is temporarily stored in the registers 221 and 222 respectively transferred to the first and second selection circuits 240 and 260 while the EOB is temporarily stored in the registers 223 and 224 respectively transferred to the first and second selection generating circuits 230 and 250.

Then, the AND gate 231 of the first selection signal generating circuit 230 logically multiplies high value '1' of one input and the EOB signal received from the register 223 through the other input to transfer the output to the first selection circuit 240. Likewise, the AND gate 251 of the second selection signal generating circuit 250 logically multiplies high value '1' of one input and the EOB signal received from the register 224 through the other input to transfer the output to the second selection circuit 240. In this case, since the AND gates 231 and 251 respectively have the one inputs continuously suppled with high signal '1', their outputs are determined by the EOB signal, respectively transferred as the selection signals to the first and second selection circuits 240 and 260. Namely, the outputs of the AND gates 231 and 251 are the same with the EOB signal.

Subsequently, the first selection circuit 240 selectively transfers the run from the register 221 or ground signal to the reference value generator 270 according to the first selection signal from the first selection generating circuit 230 while the second selection circuit 260 selectively transfers the run from the register 222 or ground signal to the accumulator 280 according to the second selection signal from the second selection generating circuit 250. Receiving the same selection signals, the first and second selection circuits 240 and 260 generate opposite signals. Namely, if the first selection circuit 240 selects the run from the register 221, the second selection circuit 260 selects the ground signal, or vice versa.

The down counter of the reference value generator 270 subtracts the level signal of '1' and the output signal of the first selection circuit 240 from the data number 64, transferring the resultant value to the error detector 292 for the reference value. Meanwhile, the accumulator 280 accumulates the feedback signal from the register 291 and the output signal of the second selection circuit 260 to transfer the accumulated value through the register 291 to the error detector 292, which compares the accumulated value with the reference value to detect whether there have occurred errors in the decoded data of the signal processor 210. If the two values are equal, the error detector 292 determines that the compressed image data has been correctly decoded by the signal processor 210 into the original data. Alternatively, if the two values are not equal, the error detector 292 determines that the compressed image data has been incorrectly decoded by the signal processor, thus generating an error signal.

More specifically describing the error detection circuit, the compressed image data is processed block by block of 8×8. When decoding the encoded signal, the image data obtained by processing the variable length block is expressed as the run, level and EOB signals. The image data made of blocks is decoded by means of counting the number of the runs. If the EOB represents '0', the value of the blocks is reproduced. If the EOB represents '1', the last bit is represented. Namely, if the EOB represents '1', and the value of the previous run and level is accumulated to give the total number of 64, it is appreciated that the compressed image data is correctly decoded. According to the present invention, if the EOB represents '0', the values of the runs are accumulated and temporarily stored into the register 291. Alternatively, if the EOB represents '1', the values of the run and level are subtracted from 64 compared to the previously accumulated value, thereby detecting the errors occurring in decoding. Especially, if the EOB represents '1', the operation control signal is applied to synchronize the down counter of the reference value generator 270 with the output signal of the first selection circuit 240 to improve the reliability of the error detection.

For example, when the EOB is '1', the run '5' and the level '8', the EOB and run are stored into the registers. The value '1' of the EOB stored in the register 223 is transferred as the selection signal through the AND gate 231 of the first selection signal generating circuit 230 to the first selection circuit 240, which consequently transfers the value of the run from the register 221 to the reference value generator 270. Then, the value of the run is synchronized with the operation control signal to operate the down counter of the reference value generator 270. The output value of the down counter is obtained by subtracting the run value of the EOB signal and the level from 64. In this case, the reference value of the reference value generator 270 is '58'. If the EOB is '0', the run value is stored into the register 222, and the value of the EOB into the register 224. Hence, the output value of the AND gate 251 of the second selection signal generating circuit 250 becomes '0', and therefore, the second selection circuit 260 selects the run value from the register 222 transferred to the accumulator 280. The accumulator 280 performs the accumulation process until the EOB becomes '1'. The accumulator 292 generates '0' representing the normal state or '1' representing the error according as the accumulated value from the accumulator 280 and the reference value from the reference value generator 270 are equal or not.

Figure 3:
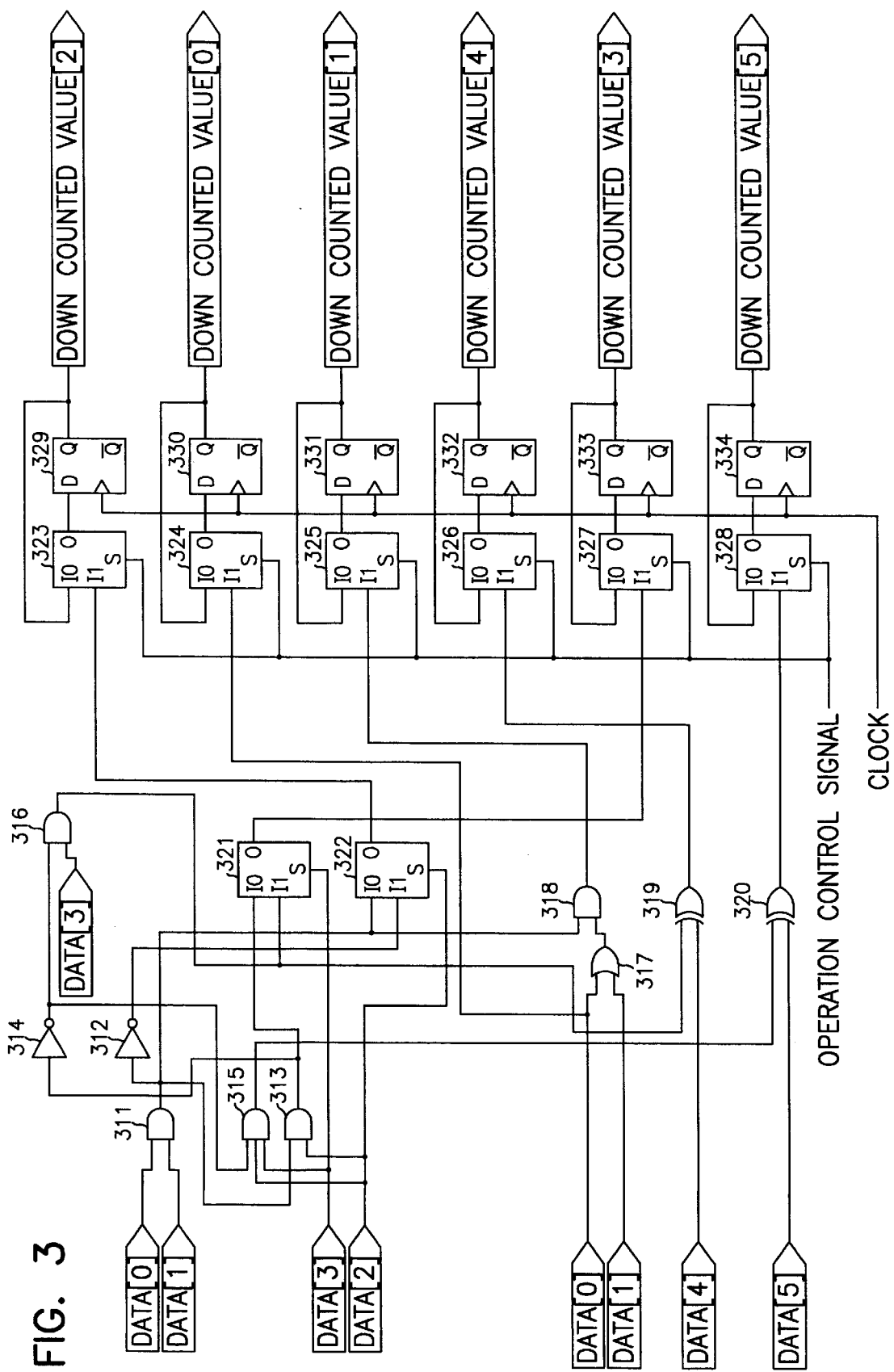
FIG. 3 is a circuit diagram for illustrating the structure of the down counter as shown in FIG. 2.

The down counter of the reference value generator 270 may be made by the conventional means as shown in FIG. 3, including AND gate 311 for receiving data [0] and [1], inverter 312 for inverting the output of the AND gate 311, AND gate 313 for the output of the AND gate 311 and data [2], inverter 314 for inverting the output of the AND gate 313, AND gate 315 for data [2] and [3] and the output of the inverter 314, AND gate 316 for data [3] and the output of the inverter 314, OR gate 317 for data [0] and [1], AND gate 318 for the outputs of the AND gate 311 and the OR gate 317, exclusive OR gate 319 for data [4] and the output of the AND gate 316, exclusive OR gate 320 for data [5] and the output of the AND gate 315, multiplexer 321 for selectively transferring one of the outputs of the AND gates 313 and 316 according to data [3] as the selection signal, multiplexer 322 for selectively transferring the output of the AND gate 311 or the inverter 312 according to data [2] as the selection signal, multiplexer 323 for selectively transferring the output of the multiplexer 322 or the feedback signal according to the operation control signal, multiplexer 324 for selectively transferring data [0] or the feedback signal according to the operation control signal, multiplexer 325 for selectively transferring the output of the AND gate 318 or the feedback signal according to the operation control signal, multiplexer 326 for selectively transferring the output of the exclusive OR gate 319 or the feedback signal according to the operation control signal, multiplexer 327 for selectively transferring the output of the multiplexer 321 or the feedback signal according to the operation control signal, multiplexer 328 for selectively transferring the output of the exclusive OR gate 320 or the feedback signal according to the operation control signal, D-flip-flop 329 for delaying the output of the multiplexer 323 according to a clock signal, D-flip-flop 330 for delaying the output of the multiplexer 324 according to a clock signal, D-flip-flop 331 for delaying the output of the multiplexer 325 according to a clock signal, D-flip-flop 332 for delaying the output of the multiplexer 326 according to a clock signal, D-flip-flop 333 for delaying the output of the multiplexer 327 according to a clock signal, and D-flip-flop 334 for delaying the output of the multiplexer 328 according to a clock signal.

The output of the D-flip-flop 329 is down counted value [2] both transferred to the error detector 292 and fed back to the multiplexer 323. The output of the D-flip-flop 330 is down counted value [0] both transferred to the error detector 292 and fed back to the multiplexer 324.

The output of the D-flip-flop 331 is down counted value [1] both transferred to the error detector 292 and fed back to the multiplexer 325. The output of the D-flip-flop 332 is down counted value [4] both transferred to the error detector 292 and fed back to the multiplexer 326. The output of the D-flip-flop 333 is down counted value [3] both transferred to the error detector 292 and fed back to the multiplexer 327. The output of the D-flip-flop 334 is down counted value [5] both transferred to the error detector 292 and fed back to the multiplexer 328.

While the present invention has been described in connection with specific embodiments accompanied by the attached drawings, it will be readily appreciated by those skilled in the art that various changes and modifications thereto may be made without departing the gist of the present invention.

What is claimed is:

1. An error detection circuit for detecting errors occurring in a data obtained by decoding a compressed image data block by block in a line length decoding system, comprising:
    a first storage device for temporarily storing the run representing the number of zeros ('0's) in said compressed image data and an end-of-block (EOB) signal externally inputted;
    a selection signal generator for generating a first and a second selection signal in response to said EOB signal supplied from said first storage device;
    a first selection circuit for selectively transferring said run supplied by said first storage device or ground signal according to said first selection signal;
    a second selection circuit for selectively transferring said run supplied by said first storage device or ground signal according to said second selection signal;
    a reference value generator for generating a reference value based on the output signal of said first selection circuit according to an operation control signal externally inputted;
    accumulator for accumulating the output of said second selection circuit based on the feedback signal from a second storage device, said second storage device temporarily storing the output of said accumulator; and
    an error detector for detecting said errors based on said reference value and the output of said second storage device.

2. An error detection circuit as defined in claim 1, wherein said first storage device comprises a first register for temporarily storing said run transferred to said first selection circuit, a second register for temporarily storing said run transferred to said second selection circuit, and a third and a fourth register for temporarily storing said EOB signal transferred to said selection signal generator.

3. The error detection circuit as defined in claim 1, wherein said selection signal generator comprises a first selection signal generating circuit for supplying said first selection signal to said first selection circuit in response to said EOB signal received from said first storage device, and a second selection signal generating circuit for supplying said second selection signal to said second selection circuit in response to said EOB signal received from said first storage device.

4. The error detection circuit as defined in claim 3, wherein each of said first and second selection signal generating circuits includes an AND gate for logically multiplying high logical value '1' of a first input and said EOB signal of a second input.

5. The error detection circuit as defined in claim 1, wherein said reference value generator includes a down counter for counting down to a given value the output signal of said first selection circuit in response to said operation control signal.

6. An error detection circuit as defined in one of said claim 1, wherein said error detector includes a comparator for comparing the output signal of said second storage device with said reference value to generate a zero ('0') signal representing the data normally decoded or an error signal ('1') representing the data incorrectly decoded according as the two compared values are equal or not.

* * * * *